US011908507B2

(12) United States Patent
Bang et al.

(10) Patent No.: US 11,908,507 B2
(45) Date of Patent: Feb. 20, 2024

(54) SEMICONDUCTOR MEMORY DEVICE AND MEMORY SYSTEM HAVING THE SAME

(71) Applicant: Samsung Electronics Co., Ltd., Suwon-si (KR)

(72) Inventors: Jongmin Bang, Hwaseong-si (KR); Seungki Hong, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 17/722,652

(22) Filed: Apr. 18, 2022

(65) Prior Publication Data
US 2023/0170009 A1 Jun. 1, 2023

(30) Foreign Application Priority Data
Nov. 30, 2021 (KR) .................. 10-2021-0168245

(51) Int. Cl.
*G11C 11/408* (2006.01)
*G11C 11/406* (2006.01)
*G11C 11/4091* (2006.01)

(52) U.S. Cl.
CPC .... *G11C 11/40615* (2013.01); *G11C 11/4085* (2013.01); *G11C 11/4087* (2013.01); *G11C 11/4091* (2013.01); *G11C 11/40622* (2013.01)

(58) Field of Classification Search
CPC ........ G11C 11/40615; G11C 11/40622; G11C 11/4085; G11C 11/4087; G11C 11/4091; G11C 8/12; G11C 11/40618; G11C 11/4097; G11C 11/40611; Y02D 10/00; H10B 12/00

USPC ............................... 365/103, 230.06
See application file for complete search history.

(56) References Cited

U.S. PATENT DOCUMENTS

| 9,236,110 B2 | 1/2016 | Bains et al. |
| 9,449,671 B2 | 9/2016 | Crawford et al. |
| 9,685,240 B1 | 6/2017 | Park |
| 9,805,783 B2 | 10/2017 | Ito et al. |
| 9,812,185 B2 | 11/2017 | Fisch et al. |
| 9,892,779 B2 | 2/2018 | Kang et al. |
| 9,997,228 B2 | 6/2018 | Lee et al. |
| 10,573,370 B2 | 2/2020 | Ito et al. |

(Continued)

FOREIGN PATENT DOCUMENTS

WO    WO-2022061153 A1 *  3/2022  ........... G06F 3/0613

*Primary Examiner* — Michael T Tran
(74) *Attorney, Agent, or Firm* — Harness, Dickey & Pierce, P.L.C.

(57) ABSTRACT

A semiconductor memory device includes a command and address generator configured to decode a command to generate an active command, and generate an address applied with the active command as a row address, a control signal generator configured to generate sequence data changing with a random sequence in response to the active command, and generate a random pick signal when the sequence data is equal to previously stored comparison data, and a memory cell array comprising an odd page memory cell array including a plurality of first memory cells and an even page memory cell array including a plurality of second memory cells, and configured to simultaneously perform the active operation and a hidden hammer refresh operation on the selected first and second memory cells in response to the row address when the random pick signal is activated in response to the active command.

20 Claims, 10 Drawing Sheets

(56) References Cited

U.S. PATENT DOCUMENTS

| | | |
|---|---|---|
| 10,950,288 B2 | 3/2021 | Nale et al. |
| 10,950,289 B2 | 3/2021 | Ito et al. |
| 11,049,545 B2 | 6/2021 | Lee |
| 11,282,564 B1* | 3/2022 | Rayaprolu ....... G11C 29/50004 |
| 2019/0333573 A1* | 10/2019 | Shin ...................... G11C 11/408 |
| 2020/0090729 A1* | 3/2020 | Son ....................... G11C 11/406 |
| 2022/0067157 A1* | 3/2022 | Le Rolland ........... G06F 3/0622 |
| 2022/0091784 A1* | 3/2022 | Brandl ............... G11C 11/40615 |
| 2022/0139481 A1* | 5/2022 | Rayaprolu .......... G06F 11/3037 |
| | | 365/185.09 |
| 2022/0148647 A1* | 5/2022 | Johnson ................ G11C 11/408 |
| 2022/0199148 A1* | 6/2022 | Hong ................ G11C 11/40615 |
| 2023/0143397 A1* | 5/2023 | Hong ................ G11C 11/40615 |
| | | 365/222 |

\* cited by examiner

SEMICONDUCTOR MEMORY DEVICE AND MEMORY SYSTEM HAVING THE SAME

CROSS-REFERENCE TO THE RELATED APPLICATION

This application claims priority from Korean Patent Application No. 10-2021-0168245, filed on Nov. 30, 2021, in the Korean Intellectual Property Office, the disclosure of which is incorporated herein by reference in its entirety.

BACKGROUND

Some example embodiments relate to a semiconductor memory device and/or a memory system having the same.

A dynamic random access memory (DRAM) device includes a plurality of DRAM cells arranged in a plurality of rows. The DRAM device performs a normal refresh operation every refresh period in order to maintain data stored in the DRAM cells of each of the plurality of rows designated by a plurality of row addresses (of each of the plurality of row addresses). Further, since data stored in DRAM cells of victim row address adjacent to a frequently accessed aggressor row address may be lost faster than data stored in DRAM cells adjacent to a normally accessed row address, the DRAM device may further perform a hammer refresh operation on the DRAM cells of the victim row address.

SUMMARY

Various example embodiments provide a semiconductor memory device capable of preventing or reducing the likelihood of and/or impact from data of memory cells of an aggressor row address being lost due to a hammer refresh operation on memory cells of a victim row address, and/or a memory system having the same.

Objects of various example embodiments are not limited to the aforementioned objects, and other unmentioned objects will be clearly understood by those of ordinary skill in the art based on the following description of the disclosure.

In accordance with some example embodiments, a semiconductor memory device includes a command and address generating circuit configured to decode a command to generate an active command, and to generate an address applied with the active command as a row address, a control signal generating circuit configured to generate sequence data that changes with a random sequence, the generating the sequence data in response to the active command, and the control signal generating circuit configured to generate a random pick signal in response to the sequence data being equal to previously stored comparison data, and a memory cell array comprising an odd page memory cell array including a plurality of first memory cells and an even page memory cell array including a plurality of second memory cells, the memory cell array (A) configured to perform an active operation on selected first memory cells in a selected page memory cell array of the odd page memory cell array or selected second memory cells in a selected page memory cell array of the even page memory cell array, the active operation based on the row address and in response to the random pick signal being deactivated in the active command, or (B) configured to simultaneously perform the active operation and a hidden hammer refresh operation on the selected first memory cells of the odd page memory cell array and the selected second memory cells of the even page memory cell array based on the row address and in response to the random pick signal being activated based on the active command.

In accordance with some example embodiments, a semiconductor memory device includes a command and address generating circuit configured to decode a command to generate an active command and a refresh command, and to generate an address applied with the active command as a row address, a control signal generating circuit configured to generate sequence data changing with random sequence in response to the active command, and to generate a random pick signal in response to the sequence data being equal to previously stored comparison data, a hammer refresh address generating circuit configured to receive the row address in response to the active command, to detect a corresponding row address as an aggressor row address in response to the same row address being applied at least a specific number of times, and to generate at least one victim row address adjacent to the aggressor row address as a hammer refresh row address together with a hammer refresh command, a normal refresh address generating circuit configured to generate a normal refresh row address in response to the refresh command, a selection circuit configured to select the hammer refresh row address in response to the hammer refresh command and select the normal refresh row address in response to the refresh command, so as to generate a refresh row address, a row decoder circuit configured to decode the row address in response to the active command and to decode the refresh row address in response to the refresh command or the hammer refresh command, so as to generate a plurality of main word line selection signals and a plurality of selection signals, and a memory cell array comprising an odd page memory cell array including a plurality of first memory cells and an even page memory cell array including a plurality of second memory cells, and configured to (1) perform an active operation on selected first memory cells a selected page memory cell array of the odd page memory cell array or selected second memory cells of a selected page memory cell array of the even page memory cell array in response to a page selection signal, the plurality of main word line selection signals, and the plurality of selection signals and based on the random pick signal being deactivated in response to the active command, or configured to (2) simultaneously perform the active operation and a hidden hammer refresh operation on the selected first memory cells of the odd page memory cell array and the selected second memory cells of the even page memory cell array in response to the plurality of main word line selection signals and the plurality of selection signals, the simultaneously performing the active operation and the hidden hammer refresh operation being regardless of the page selection signal and being based on the random pick signal is activated, the simultaneously performing the active operation and the hidden hammer refresh operation being in response to the active command The active operation and the hidden hammer refresh operation are the same.

In accordance with some example embodiments, a memory system includes a controller circuit configured to receive a command and address and transmit and receive data, and a memory configured to receive the command and address and to transmit and receive the data. The memory comprises a command and address generating circuit configured to decode a command included in the command and address to generate an active command, and to generate an address included in the command and address applied with the active command as a row address, a hidden hammer refresh control signal generator configured to generate sequence data changing with a random sequence, and generate a random pick signal when the sequence data is equal to previously stored comparison data, and a memory cell array comprising an odd page memory cell array including a plurality of first memory cells and an even page memory cell array including a plurality of second memory cells, and configured to perform an active operation on selected first memory cells or selected second memory cells of a selected page memory cell array based on the row address in response to the random pick signal being deactivated based on the active command, or to simultaneously perform the active operation and a hidden hammer refresh operation on the selected first memory cells of the odd page memory cell array and the selected second memory cells of the even page memory cell array based on the row address and in response to the random pick signal being activated in response to the active command The active operation and the hidden hammer refresh operation are the same.

BRIEF DESCRIPTION OF THE DRAWINGS

FIG. 8A, FIG. 8B, and FIG. 8C are diagrams for describing an active operation and a hidden hammer refresh operation of a semiconductor memory device according to some example embodiments of inventive concepts.

FIG. 9A and FIG. 9B are drawings for describing a hammer refresh operation of a semiconductor memory device according to some example embodiments of inventive concepts.

DETAILED DESCRIPTION OF VARIOUS EXAMPLE EMBODIMENTS

Hereinafter, a semiconductor memory device and/or a memory system having the same according to various example embodiments of inventive concepts will be described with reference to the accompanying drawings.

Figure 1:
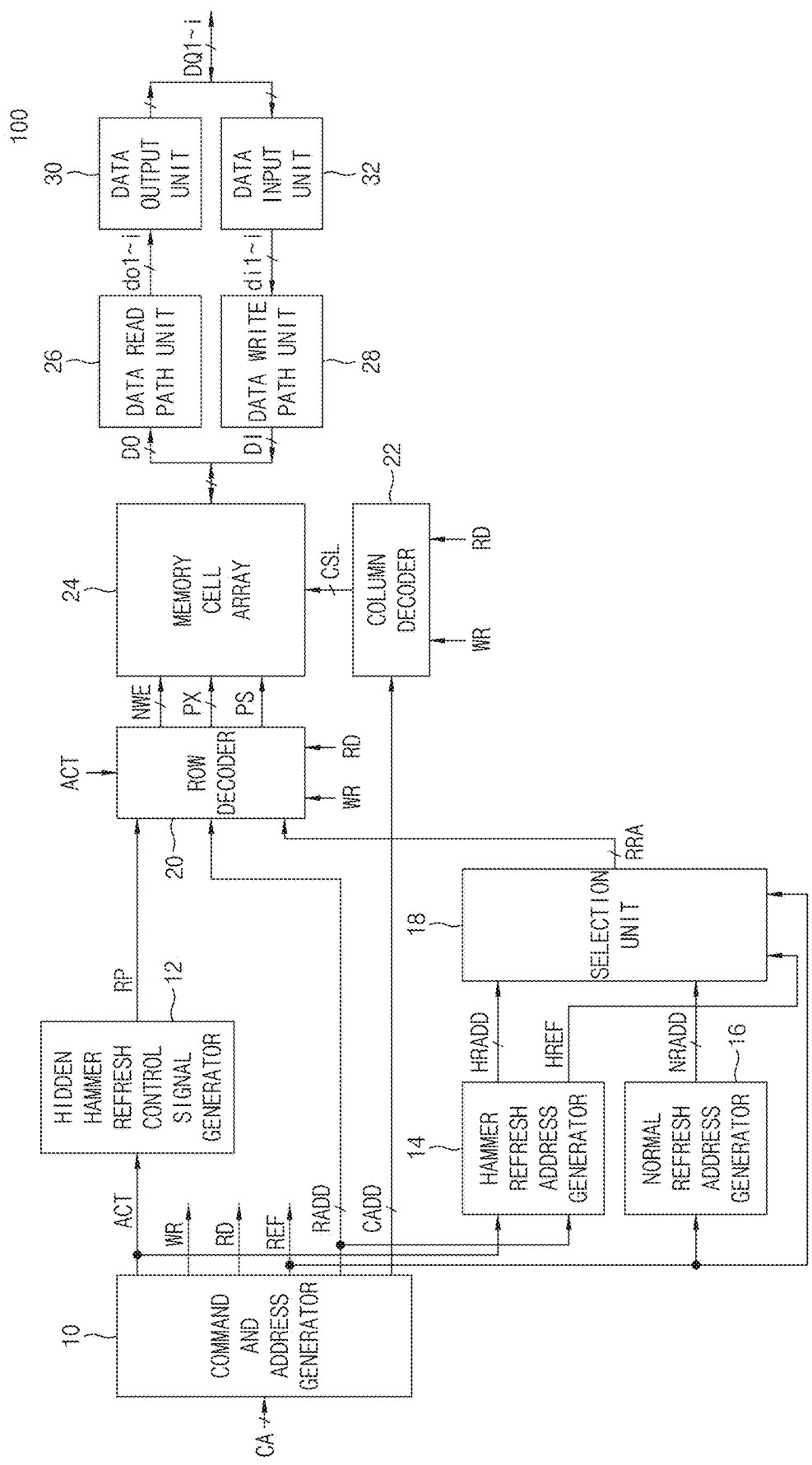
FIG. 1 is a block diagram illustrating a semiconductor memory device according to an example embodiment of inventive concepts.

FIG. 1 is a block diagram illustrating a semiconductor memory device according to some example embodiments of inventive concepts. A semiconductor memory device 100 may include a command and address generator 10, a hidden hammer refresh control signal generator 12, a hammer refresh address generator 14, a normal refresh address generator 16, a selection unit 18, a row decoder 20, a column decoder 22, a memory cell array 24, a data read path unit 26, a data write path unit 28, a data output unit 30, and a data input unit 32.

A function of each of the blocks shown in FIG. 1 will be described below.

The command and address generator 10 may decode a command included in a register, e.g. in a command and address CA so to generate one or more of an active command ACT, a read command RD, a write command WR and a refresh command REF, may generate an address included in the command and address CA as a row address RADD in response the active command ACT, and may generate the address included in the command and address CA as a column address CADD in response to the read command RD and/or the write command WR. The refresh command REF may be or may include an auto refresh command and/or a self-refresh command. When the refresh command REF is or includes the auto refresh command, the refresh command REF may be provided from the outside, and when the refresh command REF is or includes the self-refresh command, the refresh command REF may be internally generated.

The hidden hammer refresh control signal generator 12 may generate sequence data that changes based on a random sequence, may generate the sequence data in response to the active command ACT, and may generate a random pick signal RP when or if or in response to the sequence data is equal to previously stored comparison data.

The hammer refresh address generator 14 may receive the row address RADD applied with the active command ACT, and may detect a corresponding row address as an aggressor row address when the same row address RADD is applied at least a specific, or variably determined, or predetermined number of times, and may generate at least one victim row address adjacent to the aggressor row address as a hammer refresh row address HRADD. The hammer refresh address generator 14 may generate the hammer refresh row address HRADD with a hammer refresh command HREF.

The normal refresh address generator 16 may perform a counting operation in response to the refresh command REF so as to generate a normal refresh row address NRADD.

The selection unit 18 may select the hammer refresh row address HRADD in response to the hammer refresh command HREF so as to generate a refresh row address RRA, and may select the normal refresh row address NRADD in response to the refresh command REF so as to generate the refresh row address RRA.

The row decoder 20 may decode the row address RADD in response to the active command ACT so as to generate a plurality of main word line selection signals NEW and a plurality of selection signals PX, and may decode the refresh row address RRA in response to the refresh command REF or the hammer refresh command HREF so as to generate the plurality of main word line selection signals NEW and the plurality of selection signals PX. The row decoder 20 may further generate a page selection signal PS in response to the active command ACT. The random pick signal RP may be transmitted to the memory cell array 24 through the row decoder 20, or be directly applied to the memory cell array 24.

The column decoder 22 may decode the column address CADD in response to the write command WR and/or the read command RD so as to generate a plurality of column selection signals CSL.

The memory cell array 24 may include a first-parity page memory cell array (an even page memory cell array) including a plurality of first memory cells, and a second-parity memory cell array (e.g. an odd page memory cell array) including a plurality of second memory cells.

The memory cell array 24 may perform an active operation on the first memory cells and/or the second memory cells selected in a page memory cell array selected between the even page memory cell array and the odd page memory cell array by the plurality of main word line selection signals NEW, the plurality of selection signals PX, and the page selection signal PS when the random pick signal RP is deactivated in response to the active command ACT. The memory cell array 24 may simultaneously perform the active operation and the hidden refresh operation on the first memory cells selected in the even page memory cell array and the second memory cells selected in the odd page memory cell array by the plurality of main word line selection signals NEW and the plurality of selection signals regardless of the page selection signal PS when the random pick signal RP is activated in response to the active command ACT.

The memory cell array 24 may store write data DI to the memory cells of the selected page memory cell array based on the plurality of column selection signals CSL and in response to the write command WR. The memory cell array 24 may generate read data DO from the memory cells of the selected page memory cell array by the plurality of column selection signal CSL in response to the read command RD.

The memory cell array 24 may perform the normal refresh operation and the hammer refresh operation on the first memory cells selected in the even page memory cell array and the second memory cells selected in the odd page memory cell array, respectively, based on the plurality of main word line selection signals NEW and the plurality of selection signals PX, and in response to the refresh command REF and the hammer refresh command HREF, respectively. As a non-limiting example, the memory cell array 24 may perform the normal refresh operation on the first memory cells selected in the even page memory cell array and the second memory cells selected in the odd page memory cell array based on the plurality of main word line selection signals NEW and the plurality of selection signals PX and in response to the refresh command REF, and may also perform the hammer refresh operation on the first memory cells selected in the even page memory cell array or the second memory cells selected in the odd page memory cell array by the plurality of main word line selection signals NEW, the plurality of selection signals PX, and the page selection signal PS in response to the hammer refresh command HREF.

The data read path unit 26 may convert the read data DO read from the memory cell array 24 in series in response to the read command RD to generate i output data do1 to doi (where i is a natural number). For example, when 128-bit read data DO is received in parallel, the data read path unit 26 may serially convert the 128-bit read data to generate 8 16-bit output data do1 to doi.

The data write path unit 28 may convert input data di1 to dii in parallel in response to the write command WR to generate the write data DI. For example, when eight 16-bit input data di1 to dii is received in series, the data write path unit 28 may generate 128-bit write data DI.

The data output unit 30 may drive the output data do1 to doi in response to the read command RD to generate data DQ1 to DQi, and drive the input data di1 to dii in response to the write command WR to generate data DQ1 to DQi.

Figure 2:
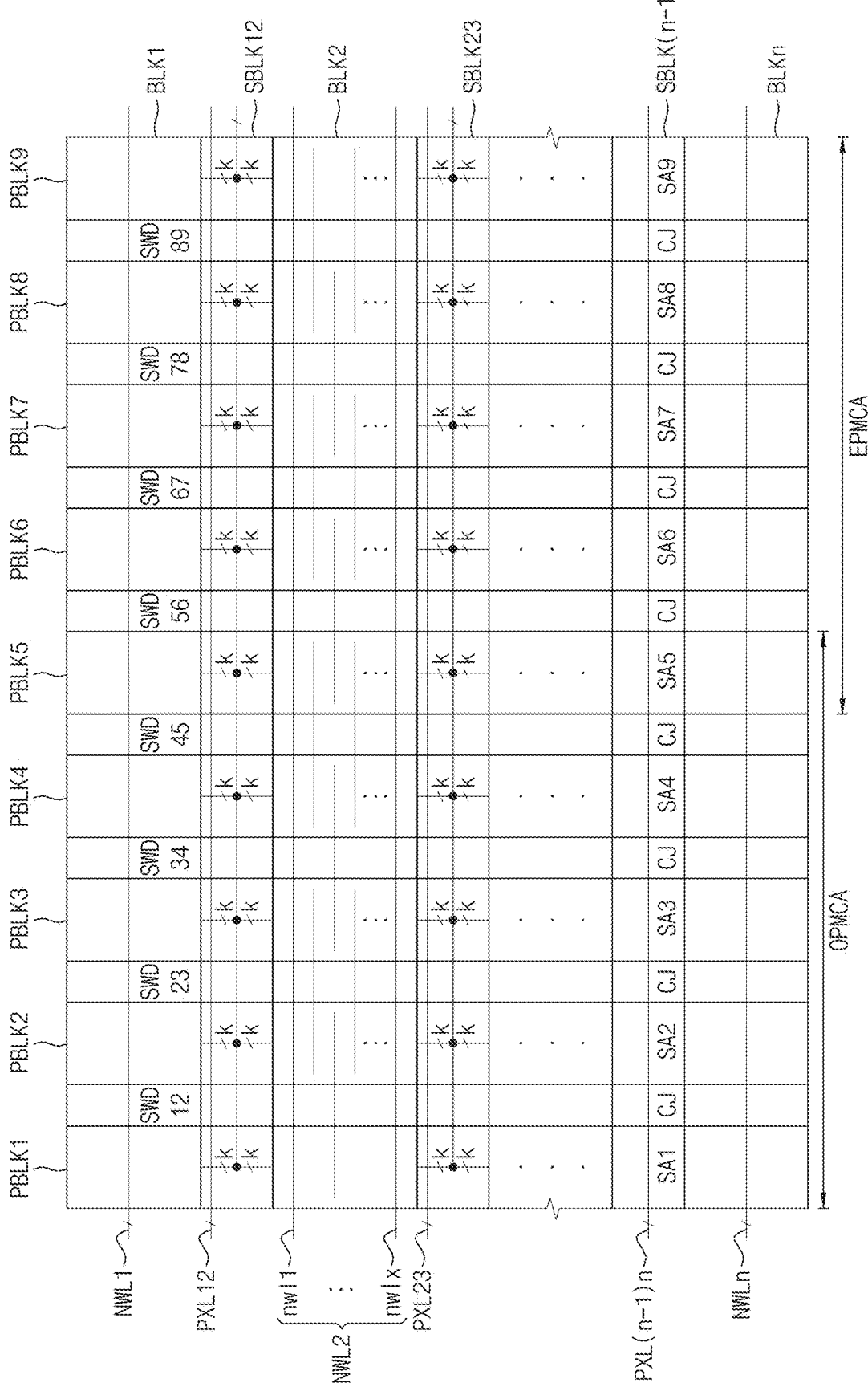
FIG. 2 is a drawing illustrating a configuration and arrangement of a memory cell array according to some example embodiments of inventive concepts.

FIG. 2 is a drawing illustrating a configuration and arrangement of a memory cell array according to some example embodiments of inventive concepts.

A configuration and arrangement of the memory cell array 24 will be described below with reference to FIG. 2.

The memory cell array 24 may include n memory cell array blocks BLK1 to BLKn, and (n−1) sense amplification blocks SBLK12 to SBLK(n−1)n. The (n−1) sense amplification blocks SBLK1 to SBLK(n−1) may be arranged between the n memory cell array blocks BLK1 to BLKn (where n is a natural number that may be the same as or different from i). Each of the n memory cell array blocks BLK1 to BLKn may include nine sub memory cell array blocks PBLK1 to PBLK9, and 8 sub word line driver blocks SWD12 to SWD89 arranged between the 9 sub memory cell array blocks PBLK1 to PBLK9. Each of the (n−1) sense amplification blocks SBLK1 to SBLK(n−1) may include nine sub sense amplification blocks SA1 to SA9, and conjunction blocks CJ arranged between the nine sub sense amplification blocks SA1 to SA9. The sub memory cell array blocks PBLK1 to PBLK5, the sub word line driver blocks SWD12 to SWD45, the sub sense amplification blocks SA1 to SA5, and the conjunction blocks CJ arranged in a left side of the memory cell array 24 may configure an odd page memory cell array OPMCA, and the sub memory cell array blocks PBLK5 to PBLK9, the sub word line driver blocks SWD56 to SWD89, the sub sense amplification blocks SA5 to SA9, and the conjunction blocks CJ arranged in a right side of the memory cell array 24 may configure an even page memory cell array EPMCA. The sub memory cell array block PBLK5 and the sub sense amplification block SA5 arranged between the odd page memory cell array OPMCA and the even page memory cell array EPMCA may be shared by the odd page memory cell array OPMCA and the even page memory cell array EPMCA.

Alternatively or additionally, each of main word line groups NWL1 to NWLn may be arranged in a direction crossing the sub memory cell array blocks PBLK1 to PBLK9 of each of the n memory cell array blocks BLK1 to BLKn. Each of the main word line groups NWL1 to NWLn may include x main word lines nwl1 to nwlx (where x is a natural number that may be the same as or different from any of i or n). Each of the selection signal line groups PXL12 to PXL(n−1)n may be arranged in a direction crossing the conjunction blocks CJ of each of the (n−1) sense amplification blocks SBLK12 to SBLK(n−1)n. The main word line groups NWL1 to NWLn and the selection signal line groups PXL12 to PXL(n−1)n may be shared by the odd page memory cell array OPMCA and the even page memory cell array EPMCA. Each of the sub word line driver blocks SWD23, SWD45, SWD67, and SWD89 may be an odd sub word line driver block driving each of an odd-numbered sub word lines SWL1, SWL3, . . . corresponding to each of the x main word lines nwl1 to nwlx. Each of the sub word line driver blocks SWD12, SWD34, SWD56, and SWD78 may be an even sub word line driver block driving each of an even-numbered sub word lines SWL2, . . . corresponding to each of the x main word lines nwl1 to nwlx. Although not shown, either or both of the page selection signal PS and the random pick signal RP may be applied to the conjunction blocks CJ. When the page selection signal PS is activated, each of the conjunction blocks CJ of the odd page memory cell array OPMCA may drive corresponding selection signals, and alternatively or additionally when the page selection signal PS is deactivated, each of the conjunction blocks CJ of the even page memory cell array EPMCA may drive corresponding selection signals. Further, when the random pick signal RP is activated, each of the conjunction blocks CJ of the odd page memory cell array OPMCA and/or each of the conjunction blocks CJ of the even page memory cell array EPMCA may drive the corresponding selection signals regardless of the page selection signal PS.

As a non-limiting example, when the random pick signal RP is deactivated, in response to the page selection signal PS, the sub word line driver blocks SWD12, SWD23, SWD34, SWD45 of the memory cell array block BLK1, BLK2, ..., or BLKn selected in the odd page memory cell array OPMCA may select sub word lines by the main word line selection signals nwl1 to nwlx and corresponding selection signals. Alternatively the sub word line driver blocks SWD56, SWD67, SWD78, SWD89 of the memory cell array block BLK1, BLK2, ..., or BLKn selected in the even page memory cell array EPMCA may select sub word lines by the main word line selection signals nwl1 to nwlx and corresponding selection signals. In this case, the active operation may be performed on memory cells connected to the selected sub word lines in the selected page memory cell array. Alternatively, when the random pick signal RP is activated, regardless of the page selection signal PS, the sub word line driver blocks SWD12 to SWD89 of the selected memory cell array block BLK1, BLK2, ..., or BLKn in the odd page memory cell array OPMCA and the even page memory cell array EPMCA (the memory cell array 24) may select sub word lines by the main word line selection signals nwl1 to nwl x and corresponding selection signals. In this case, the active operation and the hidden hammer refresh operation on the memory cells connected to the selected sub word lines of the odd page memory cell array OPMCA and the even page memory cell array EPMCA may be simultaneously or at least partially simultaneously or concurrently performed. For example, when the random pick signal RP is activated, regardless of the page selection signal PS, the active operation and the hidden hammer refresh operation may be simultaneously or at least partially simultaneously or concurrently performed on the selected memory cells in a corresponding page memory cell array and an adjacent page memory cell array (for example, the memory cell array 24).

The hidden hammer refresh operation may be the same as the active operation performed in response to the active command ACT, e.g. may have the same form and/or function and/or be performed in the same manner. The hidden hammer refresh operation may include selecting sub word lines by the sub word line driver blocks SWD12 to SWD89 in the odd page memory cell array OPMCA and the even page memory cell array EPMCA (e.g., the memory cell array 24), and amplifying data of memory cells connected to the selected sub word lines by the sense amplification blocks SBLK12, (SBLK12, SBLK23), (SBLK23, SBLK34 (not shown), ..., SBLK(n-1) arranged in one side or both sides of the selected memory cell array block BLK1, BLK2, ..., or BLKn.

Thereafter, in response to the page selection signal PS, the sub sense amplification blocks SA1 to SA5 arranged in one side or both sides of the sub memory cell array blocks PMCA1 to PMCA5 of the selected memory cell array block BLK1, BLK2, BLKn in the odd page memory cell array block OPMCA may amplify data of the selected memory cells in response to the column address CADD applied with the read command RD to generate the read data DO, or the sub sense amplification blocks SA5 to SA9 arranged in one side or both sides of the sub memory cell array blocks PMCA5 to PMCA9 of the selected memory cell array block BLK1, BLK2, BLKn in the even page memory cell array block EPMCA may amplify data of the selected memory cells in response to the column address CADD applied with the read command RD to generate the read data DO. As a non-limiting example, when k-bit read data DO is generated from each of the sub sense amplification blocks SA1 to SA9 arranged in one side or both sides of each of the sub memory cell array blocks PMCA1 to PMCA9, 4k-bit read data DO may be generated from each of the sense amplification blocks SBLK12 to SBLK(n-1)n in response to the page selection signal PS. That is, when the sub word lines SWL1 of the sub memory cell array blocks PBLK1 to PBLK5 of the memory cell array block BLK2 in the odd page memory cell array OPMCA is selected in response to the page selection signal PS, k-bit read data DO may be generated from each of the sub sense amplification blocks SA2 to SA5 arranged in both sides of the sub memory cell array blocks PBLK2 to PBLK5, and 4k-bit read data DO may be generated from each of the sense amplification blocks SBLK12 and SBLK23, and thus a total of 8k-bit read data DO may be generated.

Figure 3:
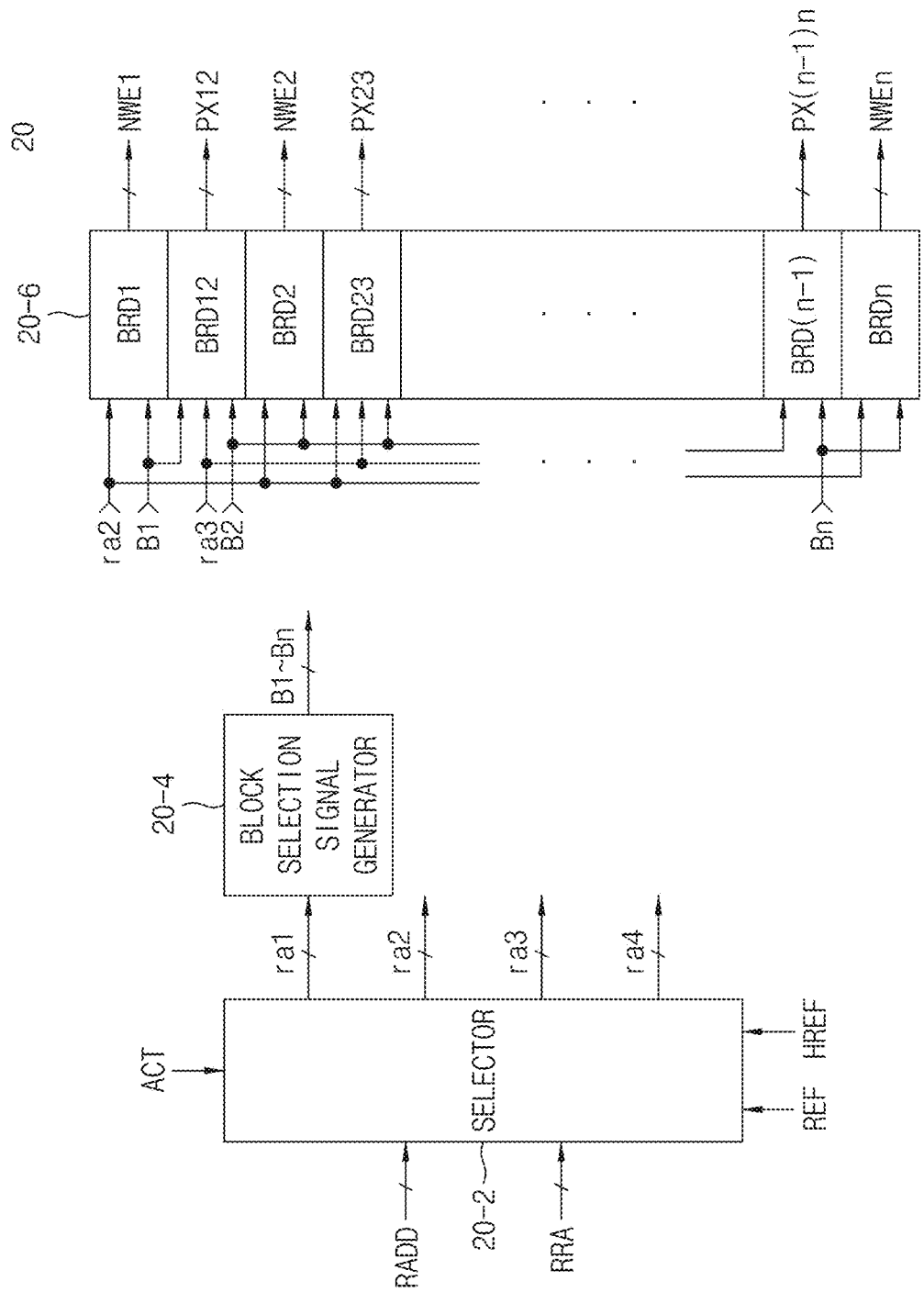
FIG. 3 is a block drawing illustrating a configuration of a row decoder according to some example embodiments of inventive concepts.

FIG. 3 is a block drawing illustrating a configuration of a row decoder according to some example embodiments of inventive concepts. The row decoder 20 may include a selector 20-2, a block selection signal generator 20-4, and a decoder 20-6.

A function of each of the blocks shown in FIG. 3 will be described below.

The selector 20-2 may select a row address RADD in response to the active command ACT or select a refresh row address RRA in response to the refresh command REF or the hammer refresh command HREF, to generate a plurality of row addresses such as first row address ra1, a second row address ra2, a third row address ra3, and a fourth row address ra4. The first row address ra1 to the fourth row address ra4 may be included in the row address RADD or the refresh row address RRA. The first row address ra1 may be used to generate block selection signals for selecting the memory cell array blocks BLK1 to BLKn, the second row address ra2 may be used to generate the main word line selection signals, the third row address ra3 may be used to generate the selection signals, and the fourth row address ra4 may be the page selection signal PS for selecting the sub word line driver blocks SWD12 to SWD45 in the odd page memory cell array OPMCA or the sub word line driver blocks SWD56 to SWD89 in the even page memory cell array EPMCA. For example, each of the row address RADD and the refresh row address RRA may be 17 bits, and the first row address ra1, the second row address ra2, the third row address ra3, and the fourth row address ra4 may be five bits, seven bits, three bits, and one bit, respectively.

The block selection signal generator 20-4 may decode the first row address ra1 to generate n block selection signals B1 to Bn. For example, the block selection signal generator 20-4 may generate 32 block selection signals B1 to B32 for selecting 32 memory cell array blocks BLK1 to BLK32 by the five-bit first row address ra1.

The decoder 20-6 may include n first decoders BRD1 to BRDn, and (n-1) second decoders BRD12 to BRD(n-1)n. Each of the n first decoders BRD1 to BRDn may decode the second row address ra2 in response to a corresponding block selection signal B1, B2, ..., or Bn to generate each of the n main word line selection signal groups NWE1 to NWEn. For example, 32 first decoders BRD1 to BRD32 may generate the main word line selection signal groups NWE1 to NWE32, respectively, for selecting 128 main word lines nwl1 to nwl128 of each of the 32 memory cell array blocks BLK1 to BLK32 by the 7-bit second row address ra2. Each of the (n-1) second decoders BRD12 to BRD(n-1)n may decode the third row address ra3 in response to a corresponding block selection signal (B1 or B2), (B2 or B3), ..., or (B(n-1) or Bn) to generate each of the (n-1)

selection signal groups PX12 to PX(n−1)n. For example, the (n−1) second decoders BRD12 to BRD(n−1)n may generate the selection signal line groups PX12 to PX(n−1)n, respectively, for selecting 8 selection signal lines of each of the (n−1) sense amplification blocks SA12 to SA(n−1)n by the 3-bit third row address ra3. 8 sub word lines SWL1 to SWL8 corresponding to each of the main word lines nwl1 to nwlx may be selected in response to the selection signal groups PX12, PX23, . . . , or PX(n−1)n.

Figure 4:
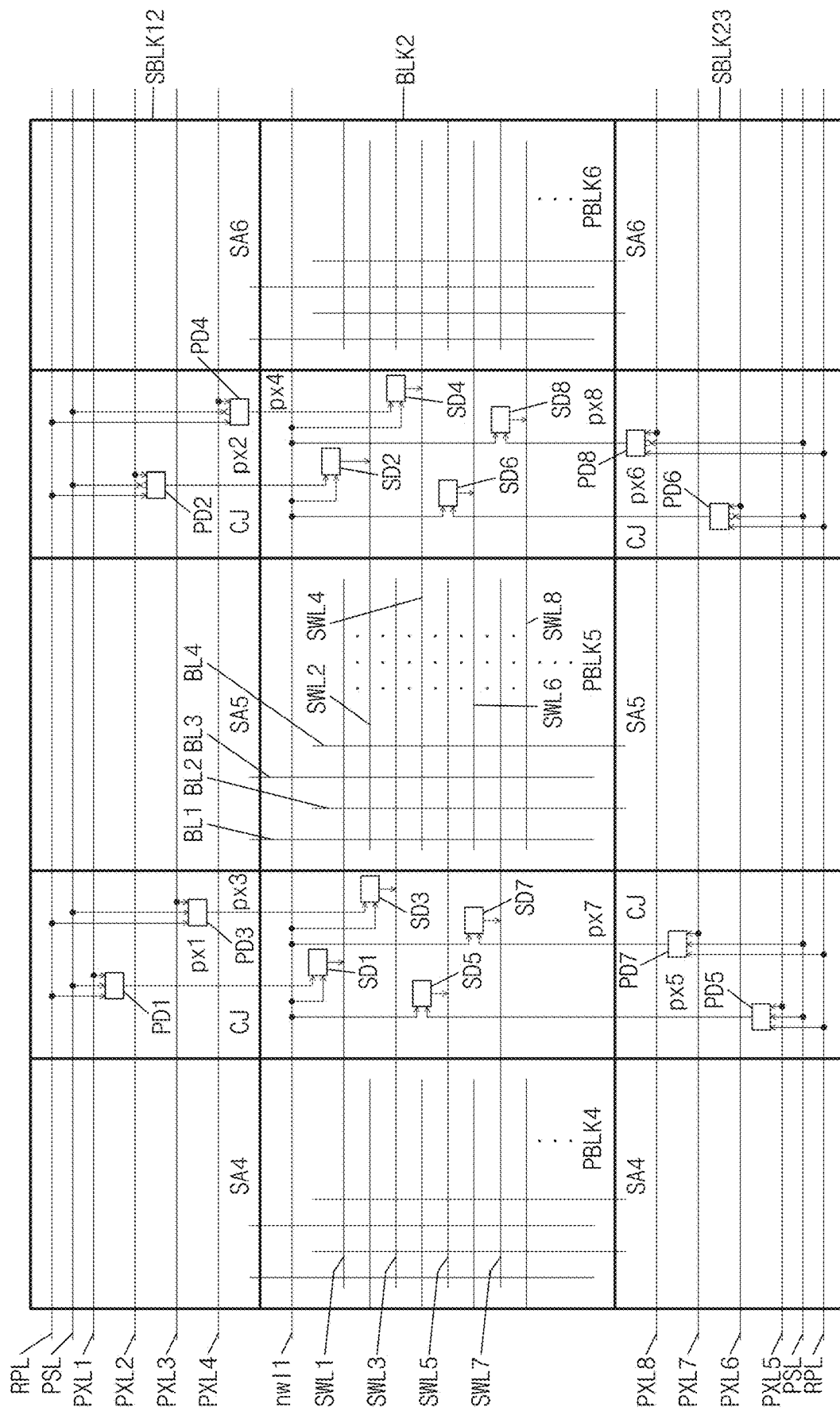
FIG. 4 is a drawing illustrating a configuration of sub word line driver blocks and conjunction blocks according to some example embodiments of inventive concepts.

FIG. 4 is a drawing illustrating a configuration of sub word line driver blocks and conjunction blocks according to some example embodiments of inventive concepts. FIG. 4 illustrates a configuration of the sub word line driver blocks SWD45 and SWD56 of the memory cell array block BLK2 and the conjunction blocks CJ arranged in both side of the sub sense amplification blocks SA5 of the sense amplification blocks SBLK12 and SBLK23 arranged in both sides of the memory cell array block BLK2. In addition, FIG. 4 illustrates a configuration of the sub word line driver blocks SWD45 and SWD56 and the conjunction blocks CJ when x main word lines nwl1 to nwlx (x is a natural number) are arranged in the memory cell array block BLK2, 8 sub word lines SWL1 to SWL8 corresponding to each of the x main word lines nwl1 to nwlx are arranged in each of the sub memory cell array blocks PBLK4, PBLK5, PBLK6, a random pick signal line RPL, a page selection signal line PSL, and 4 selection signal lines PXL1 to PXL4 are arranged in the sense amplification block SBLK12, and the random pick signal line RPL, the page selection signal line PSL, and 4 selection signal lines PXL5 to PXL8 are arranged in the sense amplification block SBLK23. In addition, FIG. 4 illustrates a configuration in which y bit lines BL1 to Bly (y is a natural number that may be the same as, greater than, or less than x) are arranged in an orthogonal direction to the sub word lines SWL1 to SWL8 in each of the sub memory cell array blocks PBLK4, PBLK5, and PBLK6, odd-numbered bit lines are connected to the sub sense amplification block SA5 of the sense amplification block SBLK12, and even-numbered bit lines are connected to the sub sense amplification block SA5 of the sense amplification block SBLK23. Although not shown, the memory cell may be connected between each of the sub word lines SWL1 to SWL8 and each of the bit lines BL1 to Bly. Each of the memory cells may be or may include a dynamic random access memory (DRAM) cell including one transistor and one capacitor, and/or including one transistor and one memristor. The semiconductor memory device 100 shown in FIG. 1 may be or may include a DRAM device.

With reference to FIG. 4, the conjunction block CJ arranged in a left side of the sub sense amplification block SA5 in the sense amplification block SBLK12 may include a first selection signal driver PD1 driving a first selection signal PX1 in response to the random pick signal RP and the page selection signal PS to generate a first sub word line selection signal px1, and a third selection signal driver PD3 driving a third selection signal PX3 in response to the random pick signal RP and the page selection signal PS to generate a third sub word line selection signal px3.

The conjunction block CJ arranged in a right side of the sub sense amplification block SA5 in the sense amplification block SBLK12 may include a second selection signal driver PD2 driving a second selection signal PX2 in response to the random pick signal RP and the page selection signal PS to generate a second sub word line selection signal px2, and a fourth selection signal driver PD4 driving a fourth selection signal PX4 in response to the random pick signal RP and the page selection signal PS to generate a fourth sub word line selection signal px4.

The conjunction block CJ arranged in a left side of the sub sense amplification block SA5 in the sense amplification block SBLK23 may include a first selection signal driver PD1 driving a fifth selection signal PX5 in response to the random pick signal RP and the page selection signal PS to generate a fifth sub word line selection signal px5, and a seventh selection signal driver PD7 driving a seventh selection signal PX7 in response to the random pick signal RP and the page selection signal PS to generate a seventh sub word line selection signal px7.

The conjunction block CJ arranged in a right side of the sub sense amplification block SA5 in the sense amplification block SBLK23 may include a sixth selection signal driver PD6 driving a sixth selection signal PX6 in response to the random pick signal RP and the page selection signal PS to generate a sixth sub word line selection signal px6, and an eighth selection signal driver PD8 driving an eighth selection signal PX8 in response to the random pick signal RP and the page selection signal PS to generate an eighth sub word line selection signal px8.

The sub word line driver block SWD45 may include first, third, fifth, and seventh sub word line drivers SD1, SD3, SD5, and SD7 combining and driving the main word line selection signal NWE1 and the first, the third, the fifth, and the seventh sub word line selection signals px1, px3, px5, and px7, respectively, to select the first, the third, the fifth, and the seventh sub word lines SWL1, SWL3, SWL5, and SWL7, respectively.

The sub word line driver block SWD56 may include second, fourth, sixth, and eighth sub word line drivers SD2, SD4, SD6, and SD8 combining and driving the main word line selection signal NWE1 and the second, the fourth, the sixth, and the eighth sub word line selection signals px2, px4, px6, and px8, respectively, to select the second, the fourth, the sixth, and the eighth sub word lines SWL2, SWL4, SWL6, and SWL8, respectively.

Figure 5:
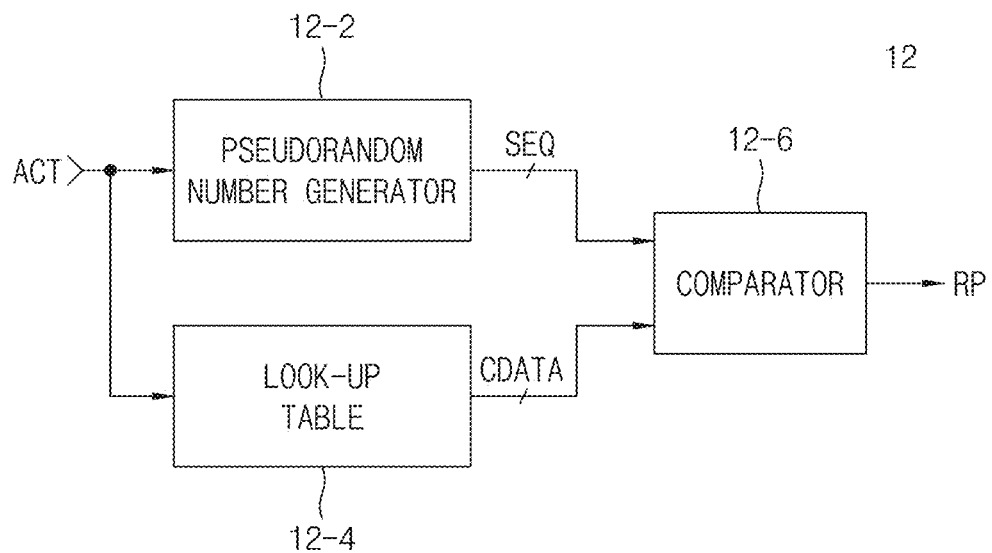
FIG. 5 is a block diagram illustrating a configuration of a hidden hammer refresh control signal generator according to some example embodiments of inventive concepts.

FIG. 5 is a block diagram illustrating a configuration of a hidden hammer refresh control signal generator according to some example embodiments of inventive concepts. The hidden hammer refresh control signal generator 12 may include a pseudorandom number generator 12-2, a look-up table 12-4, and a comparator 12-6.

A function of each of the blocks shown in FIG. 5 will be described below.

The pseudorandom number generator 12-2 may perform a certain random number generation process such as but not limited to a linear feedback shifting operation in response to the active command ACT to generate sequence data SEQ changing with a random sequence.

The look-up table 12-4 may store at least one among the data changing with the random sequence as comparison data CDATA, and output the comparison data CDATA in response to the active command ACT. As an example, the look-up table 12-4 may store a part of bits of the at least one among data changing with a random sequence as the comparison data CDATA.

The comparator 12-6 may generate the random pick signal RP when the sequence data SEQ is equal to the comparison data CDATA. As an example, the comparator 12-6 may generate the random pick signal RP when a part of bits of the sequence data SEQ and the comparison data CDATA are the same.

Figure 6:
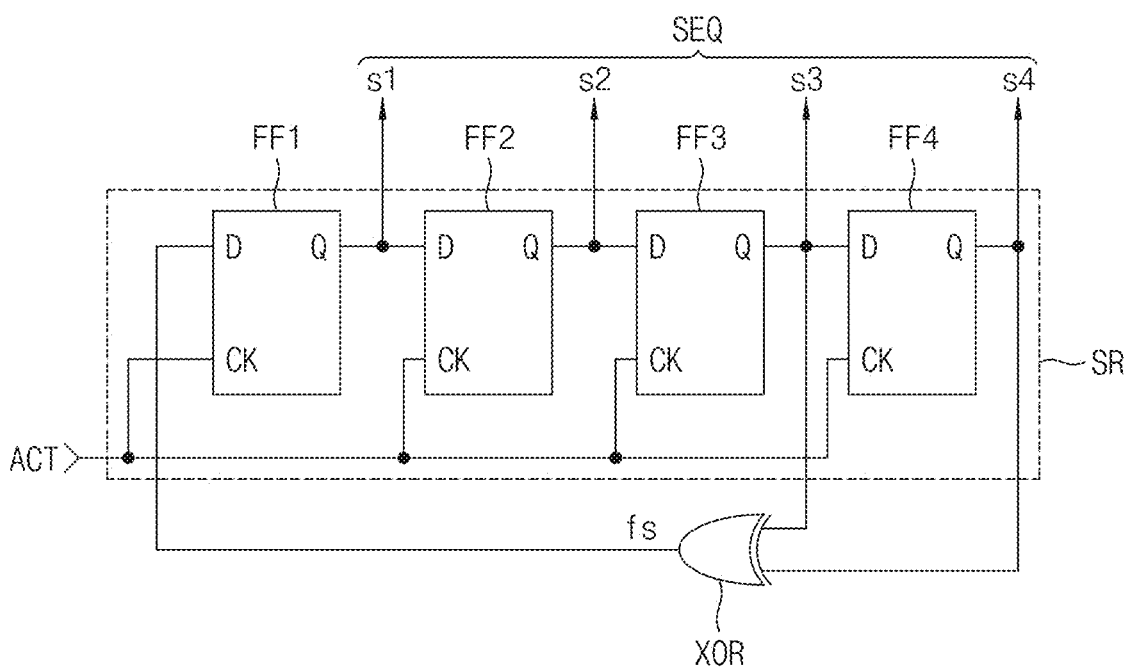
FIG. 6 is a block diagram illustrating a pseudorandom number generator according to some example embodiments of inventive concepts.

FIG. 6 is a block diagram illustrating a pseudorandom number generator according to some example embodiments of inventive concepts. The pseudorandom number generator 12-2 may include a shift register SR and an exclusive-OR (XOR) gate XOR. The shift register SR may include 4 flip-flops FF1 to FF4.

With reference to FIG. 6, when the active command ACT is generated, feedback data fs output from the XOR gate XOR and output data s1 to s3 output from output terminals Q of the flip-flops FF1 to FF3 may be input to input terminals D of the flip-flops FF1 to FF4, respectively. That is, the 4 flip-flops FF1 to FF4 and the XOR gate XOR may be a linear feedback shift register generating the sequence data SEQ changing with a predetermined random sequence according to a characteristic polynomial, for example, $x^4+x^3+1$, in response to the active command ACT.

Figure 7:
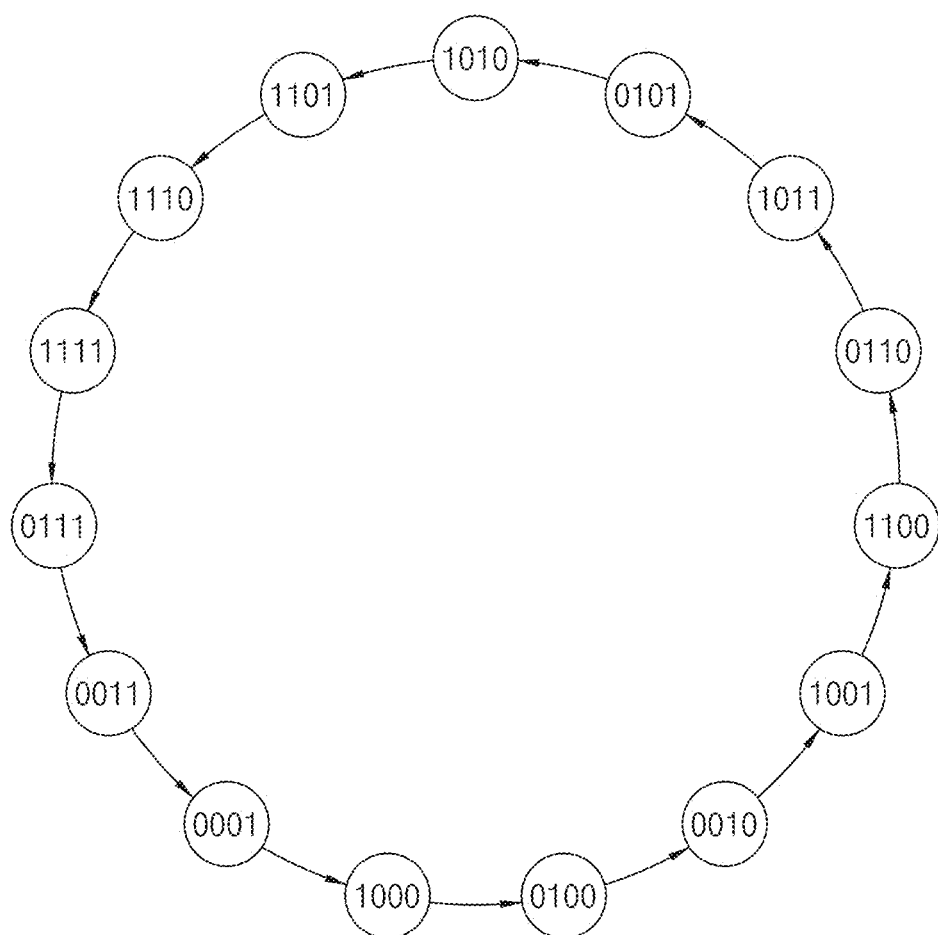
FIG. 7 is a diagram illustrating a sequence of sequence data output from a pseudorandom number generator according to some example embodiments of inventive concepts.

FIG. 7 is a diagram illustrating a sequence of sequence data output from a pseudorandom number generator according to some example embodiments of inventive concepts. The pseudorandom number generator 12-2 shown in FIG. 6 may perform the linear feedback shifting operation according to the characteristic polynomial, for a non-limiting example, $x^4+x^3+1$, and repeatedly generate data changing with the sequence of as a non-limiting example "1010"→"1101"→ . . . →"0101" except for "0000" as the sequence data SEQ.

For convenience of description, an example in which the pseudorandom number generator 12-2 described with reference to FIG. 6 and FIG. 7 generates four-bit sequence data SEQ is described, but in practice, the pseudorandom number generator 12-2 may generate a greater number of larger bits of sequence data SEQ. For example, when the pseudorandom number generator 12-2 includes an n-bit linear feedback shift register, $(2^n-1)$ n-bit sequence data SEQ may be generated.

Figures 8A, 8B:
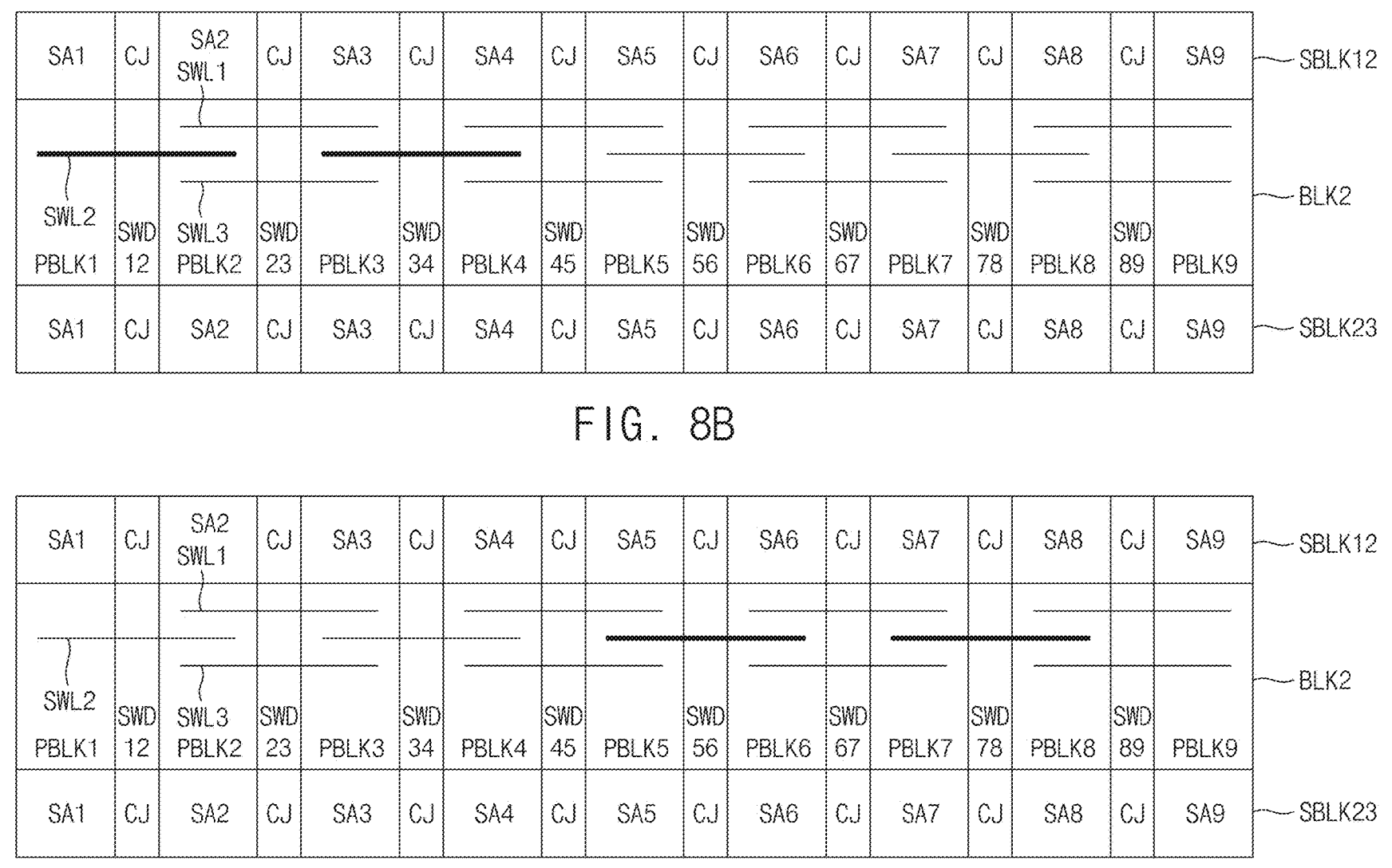
Figure 8C:
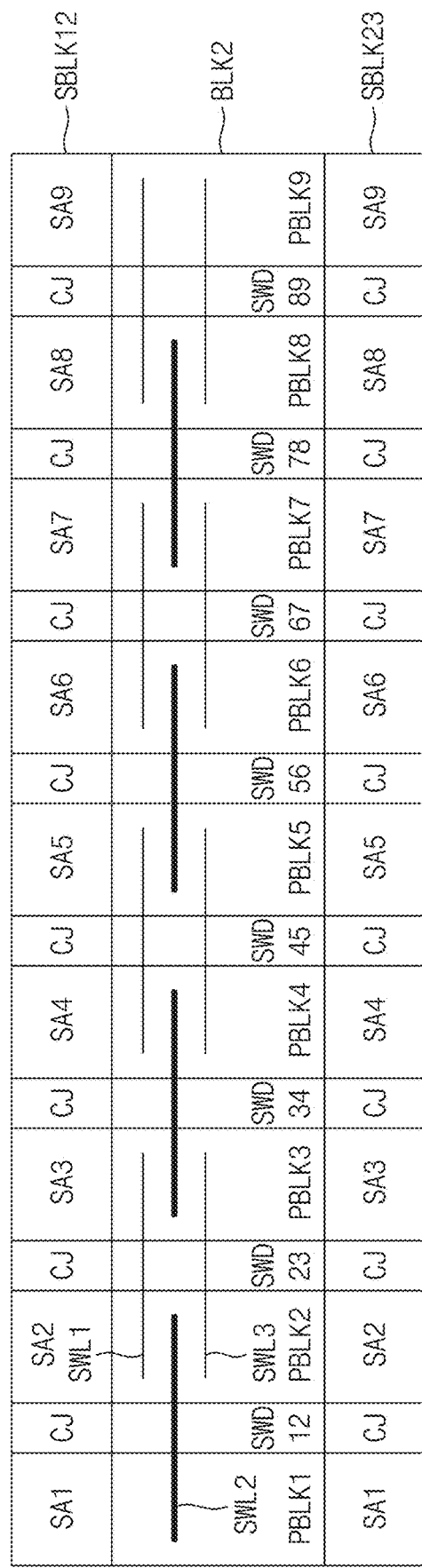

FIG. 8A, FIG. 8B, and FIG. 8C are diagrams for describing an active operation and a hidden hammer refresh operation of a semiconductor memory device according to some example embodiments of inventive concepts.

Referring to FIG. 8A, when the random pick signal RP is deactivated in response to the active command ACT and the page selection signal PS designates the odd page memory cell array OPMCA, the active operation may be performed on memory cells connected to the sub word line SWL2 (shown in bold lines) of the sub memory cell array blocks PBLK1 to PBLK4 of the memory cell array block BLK2 in the odd page memory cell array OPMCA by the first row address ra1, the second row address ra2, and the third row address ra3.

Referring to FIG. 8B, when the random pick signal RP is deactivated in response to the active command ACT and the page selection signal PS designates the even page memory cell array EPMCA, the active operation may be performed on memory cells connected to the sub word line SWL2 (shown in bold lines) of the sub memory cell array blocks PBLK5 to PBLK8 of the memory cell array block BLK2 in the even page memory cell array EPMCA by the first row address ra1, the second row address ra2, and the third row address ra3.

Referring to FIG. 8C, when the random pick signal RP is activated in response to the active command ACT, the active operation and the hidden hammer refresh operation may be performed on memory cells connected to the sub word line SWL2 (shown in bold lines) of the sub memory cell array blocks PBLK1 to PBLK8 of the memory cell array block BLK2 by the first row address ra1, the second row address ra2, and the third row address ra3, regardless of the page selection signal PS.

Figures 9A, 9B:
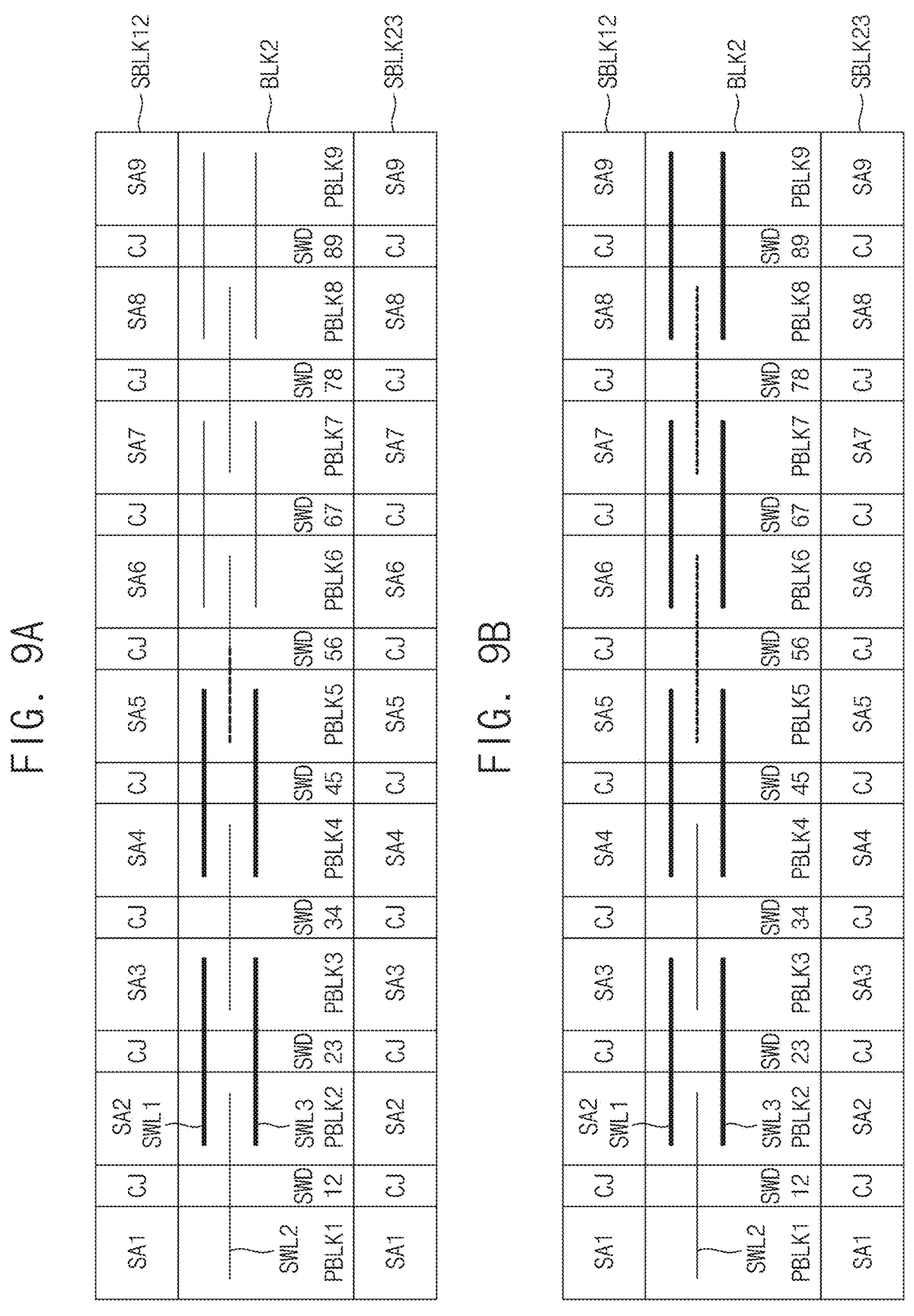

FIG. 9A and FIG. 9B are drawings for describing a hammer refresh operation of a semiconductor memory device according to some example embodiments of inventive concepts. FIG. 9A and FIG. 9B are drawings for describing an operation when a row address RADD corresponding to sub word lines SWL2 of the sub memory cell array blocks PBLK1 to PBLK5 of the memory cell array block BLK2 in the odd page memory cell array OPMCA is an aggressor row address.

Referring to FIG. 9A, when the refresh row address RRA includes the page selection signal PS, the hammer refresh operation may be performed on memory cells connected to sub word lines SWL1 and SWL3 (shown in bold lines) of the sub memory cell array blocks PBLK2 to PBLK5. In this case, due to the hammer refresh operation, data stored in memory cells connected to a sub word line SWL2 (shown in a bold and dotted line) of the sub memory cell array block PBLK5 may be lost.

Referring to FIG. 9B, when the refresh row address RRA does not include the page selection signal PS, the hammer refresh operation may be performed on memory cells connected to sub word lines SWL1 and SWL3 (shown in bold lines) of the sub memory cell array blocks PBLK2 to PBLK8. In this case, due to the hammer refresh operation, data stored in memory cells connected to sub word lines SWL2 (shown in bold and dotted lines) of the sub memory cell array blocks PBLK5 to PBLK8 may be lost.

However, according to various example embodiments of inventive concepts, when the random pick signal RP is generated in response to the active command ACT and the random pick signal RP is activated, as shown in FIG. 8C, the active operation and the hidden hammer refresh operation may be simultaneously or at least partially simultaneously and randomly performed on the memory cells connected to the selected sub word lines in the odd page memory cell array OPMCA and the even page memory cell array EPMCA in response to the row address RADD applied with the active command ACT regardless of the page selection signal PS. Accordingly, as shown in FIG. 9A and FIG. 9B, due to the hammer refresh operation on the memory cells of the victim row addresses, data stored in the memory cells of the aggressor row address may not be lost or may have a lower probability of or propensity to be lost.

Figure 10:
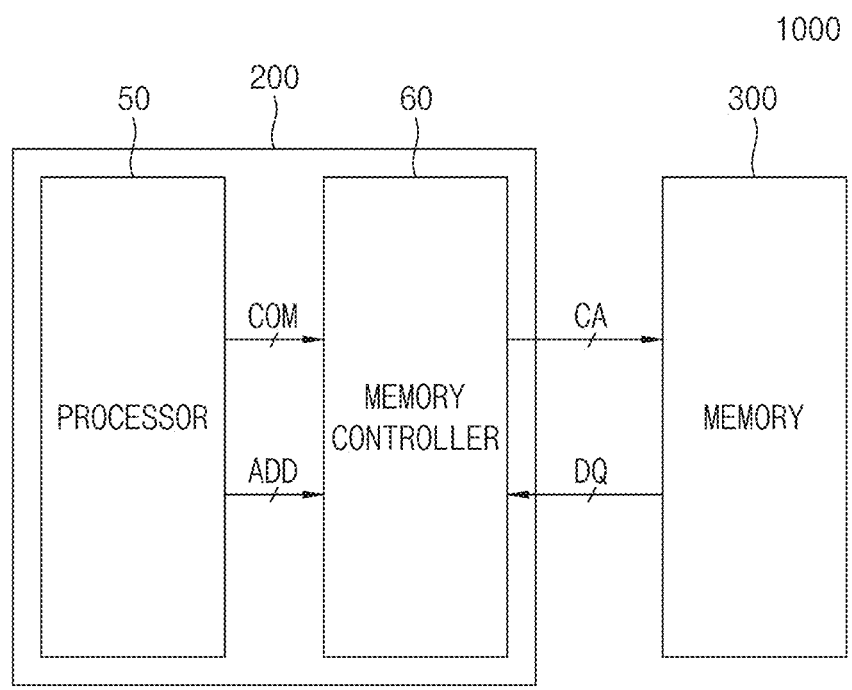
FIG. 10 is a block diagram illustrating a memory system according to some example embodiments of inventive concepts.

FIG. 10 is a block diagram illustrating a memory system according to some example embodiments of inventive concepts. The memory system 1000 may include a control unit 200 and a memory 300. The control unit 200 may include a processor 50 and a memory controller 60.

A function of each of the blocks shown in FIG. 10 will be described below.

The processor 50 may execute a program or application, and generate a command signal COM and an address signal ADD.

The memory controller 60 may receive the command signal COM and the address signal ADD, encode the command signal COM and the address signal ADD to generate a command and address CA, and transmit and receive data DQ.

The memory 300 may be or may include the semiconductor memory device described above with reference to FIG. 1 to FIG. 9B, or be a memory module including a plurality of the semiconductor memory devices. The memory 300 may perform the active operation or simultaneously perform the active operation and the hidden hammer refresh operation in response to the active command ACT as described above with reference to FIG. 1 to FIG. 9B. Further, the memory 300 may receive the data DQ to perform the write operation in the write command WR, and perform the read operation in response to the read command RD to output the data DQ.

According to some example embodiments of inventive concepts, the semiconductor memory device and the memory system having the same may simultaneously or concurrently perform the active operation and the hidden hammer refresh operation on the randomly selected row address in response to the active command without spending extra time or spending a reduced amount of extra time for the hidden hammer refresh operation, and thus data stored in the memory cells of the aggressor row address may not be lost or may be less likely to be lost by the memory cells of the victim row address.

Accordingly, the semiconductor memory device and the memory system having the same may minimize or reduce additional size overhead and/or power consumption for performing the hidden hammer refresh operation, and/or may improve reliability of the operation.

Any of the elements and/or functional blocks disclosed above may include or be implemented in processing circuitry such as hardware including circuits or logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc. Furthermore any of the elements and/or functional blocks disclosed above may be connected to any other ones of the elements and/or functional blocks disclosed above. For example, there may be a one-way or a two-way communication between one element or functional block, and another element or functional block. One element or functional block may be able to send and/or receive data and/or commands to any another element and/or functional block, directly and/or through a bus such as a wired and/or wireless communication bus. The data and/or the commands may be sent and/or received in a serial and/or parallel manner, and may be digital data and/or analog data.

While various example embodiments of inventive concepts have been described with reference to the accompanying drawings, it will be understood by those of ordinary skill in the art that various modifications may be made without departing from the scope of inventive concepts and without changing essential features thereof. Example embodiments are not necessarily mutually exclusive. For example, some example embodiments may include one or more features described with reference to one or more figures, and may also include one or more other features described with reference to one or more other figures. Therefore, the above-described example embodiments should be considered in a descriptive sense only and not for the purposes of limitation.

What is claimed is:

1. A semiconductor memory device comprising:
   a command and address generator configured to decode a command to generate an active command, and to generate an address applied with the active command as a row address;
   a control signal generator configured to generate sequence data that changes with a random sequence, the generating the sequence data in response to the active command, and the control signal generator configured to generate a random pick signal in response to the sequence data being equal to previously stored comparison data; and
   a memory cell array comprising an odd page memory cell array including a plurality of first memory cells and an even page memory cell array including a plurality of second memory cells, the memory cell array configured to perform an active operation on selected first memory cells in a selected page memory cell array of the odd page memory cell array or selected second memory cells in a selected page memory cell array of the even page memory cell array, the active operation based on the row address and in response to the random pick signal being deactivated in the active command, or configured to simultaneously perform the active operation and a hidden hammer refresh operation on the selected first memory cells of the odd page memory cell array and the selected second memory cells of the even page memory cell array based on the row address and in response to the random pick signal being activated based on the active command.

2. The semiconductor memory device according to claim 1, wherein the row address includes a page selection signal for selecting the even page memory cell array and the odd page memory cell array, and
   the active operation and the hidden hammer refresh operation are the same.

3. The semiconductor memory device according to claim 2, wherein the command and address generator is configured to decode the command and further generate a refresh command,
   wherein the semiconductor memory device further comprises:
   a hammer refresh address generator configured to receive the row address in response to the active command, to detect a corresponding row address as an aggressor row address in response to the same row address being applied at least a specific number of times, and to generate at least one victim row address adjacent to the aggressor row address as a hammer refresh row address together with a hammer refresh command;
   a normal refresh address generator configured to a normal refresh row address in response to the refresh command;
   a selection circuit configured to select the hammer refresh row address in response to the hammer refresh command or select the normal refresh row address in response to the refresh command, to generate a refresh row address; and
   a row decoder configured to decode the row address in response to the active command and decode the refresh row address in response to the refresh command or the hammer refresh command, and to generate a plurality of main word line selection signals and a plurality of selection signals.

4. The semiconductor memory device according to claim 1, wherein control signal generator comprises:
   a pseudorandom number generator configured to perform a linear feedback shifting operation in response to the active command to generate the sequence data changing with the random sequence;
   a look-up table configured to store and output at least one among the sequence data as the comparison data; and a comparator configured to generate the random pick signal in response to the sequence data being equal to the comparison data.

5. The semiconductor memory device according to claim 4, wherein control signal generator is configured to generate the random pick signal in response to at least a part of bits of the sequence data and the comparison data being the same.

6. The semiconductor memory device according to claim 3, wherein the memory cell array comprises:
a plurality of memory cell array blocks; and
a plurality of sense amplification blocks arranged between the plurality of memory cell array blocks, and
wherein each of the plurality of memory cell array blocks comprises:
a plurality of sub memory cell array blocks; and
a plurality of even sub word line driver blocks and odd sub word line driver blocks alternately arranged between the plurality of sub memory cell array blocks,
wherein each of the plurality of sense amplification blocks comprises:
a plurality of sub sense amplification blocks; and
a plurality of conjunction blocks arranged between the plurality of sub sense amplification blocks, and
wherein the sub memory cell array blocks arranged in both sides of each of the plurality of even sub word line driver blocks among the plurality of sub memory cell array blocks are included in the even page memory cell array, and the sub memory cell array blocks arranged in both sides of each of the plurality of odd sub word line driver blocks among the plurality of sub memory cell array blocks are included in the odd page memory cell array.

7. The semiconductor memory device according to claim 6, wherein each of the plurality of memory cell array blocks comprises:
a plurality of main word lines crossing the plurality of sub memory cell array blocks,
wherein each of the plurality of sub memory cell array blocks comprises:
a plurality of sub word lines corresponding to each of the plurality of main word lines, and
wherein each of the plurality of sense amplification blocks comprises:
a plurality of selection signal lines arranged crossing the plurality of conjunction blocks.

8. The semiconductor memory device according to claim 7, wherein the row address comprises a first row address to a fourth row address, and
wherein the row decoder comprises:
a selector configured to select the row address in response to the active command and select the refresh row address in response to the refresh command or the hammer refresh command, to generate the first row address to the fourth row address;
a block selection signal generator configured to decode the first row address to generate a plurality of block selection signals for selecting the plurality of memory cell array blocks;
a plurality of first decoders configured to decode the first row address in response to at least one among the plurality of block selection signals so as to generate a plurality of main word line selection signals for selecting the plurality of main word lines; and
a plurality of second decoders configured to decode the second row address in response to at least one among the plurality of block selection signals to generate a plurality of selection signals for selecting the plurality of selection signal lines, and
wherein the fourth row address is the page selection signal.

9. The semiconductor memory device according to claim 8, wherein each of the plurality of conjunction blocks comprises:
a plurality of selection signal drivers configured to drive the plurality of selection signals in response to the random pick signal and the fourth row address so as to generate a plurality of sub word line selection signals.

10. The semiconductor memory device according to claim 9, wherein each of the even sub word line driver blocks comprises:
a plurality of even sub word line drivers configured to select even-numbered sub word lines among the plurality of sub word lines of each of the sub memory cell array blocks in both sides in response to each of the plurality of main word line selection signals and even-numbered sub word line selection signals among the plurality of sub word line selection signals, and
wherein each of the odd sub word line driver blocks comprises:
a plurality of odd sub word line drivers configured to select odd-numbered sub word lines among the plurality of sub word lines of each of the sub memory cell array blocks in both sides in response to each of the plurality of main word line selection signals and odd-numbered sub word line selection signals among the plurality of sub word line selection signals.

11. A semiconductor memory device comprising:
a command and address generator configured to decode a command to generate an active command and a refresh command, and to generate an address applied with the active command as a row address;
a control signal generator configured to generate sequence data changing with random sequence in response to the active command, and to generate a random pick signal in response to the sequence data being equal to previously stored comparison data;
a hammer refresh address generator configured to receive the row address in response to the active command, to detect a corresponding row address as an aggressor row address in response to the same row address being applied at least a specific number of times, and to generate at least one victim row address adjacent to the aggressor row address as a hammer refresh row address together with a hammer refresh command;
a normal refresh address generator configured to generate a normal refresh row address in response to the refresh command;
a selection circuit configured to select the hammer refresh row address in response to the hammer refresh command and select the normal refresh row address in response to the refresh command, so as to generate a refresh row address;
a row decoder configured to decode the row address in response to the active command and to decode the refresh row address in response to the refresh command or the hammer refresh command, so as to generate a plurality of main word line selection signals and a plurality of selection signals; and
a memory cell array comprising an odd page memory cell array including a plurality of first memory cells and an even page memory cell array including a plurality of second memory cells, and configured to perform an active operation on selected first memory cells a selected page memory cell array of the odd page memory cell array or selected second memory cells of a selected page memory cell array of the even page memory cell array in response to a page selection signal, the plurality of main word line selection signals, and the plurality of selection signals and based on the random pick signal being deactivated in response to the active command, or configured to simultaneously perform the active operation and a hidden hammer refresh operation on the selected first memory cells of the odd page memory cell array and the selected second memory cells of the even page memory cell array in response to the plurality of main word line selection signals and the plurality of selection signals, the simultaneously performing the active operation and the hidden hammer refresh operation being regardless of the page selection signal and being based on the random pick signal is activated, the simultaneously performing the active operation and the hidden hammer refresh operation being in response to the active command, wherein the active operation and the hidden hammer refresh operation are the same.

12. The semiconductor memory device according to claim 11, wherein control signal generator comprises:
 a pseudorandom number generator configured to perform a linear feedback shifting operation in response to the active command to generate the sequence data changing with the random sequence;
 a look-up table configured to store and output at least one among the sequence data as the comparison data; and
 a comparator configured to generate the random pick signal when the sequence data is equal to the comparison data.

13. The semiconductor memory device according to claim 12, wherein the memory cell array comprises:
 a plurality of memory cell array blocks; and
 a plurality of sense amplification blocks arranged between the plurality of memory cell array blocks,
 wherein each of the plurality of memory cell array blocks comprises:
 a plurality of sub memory cell array blocks;
 a plurality of even sub word line driver blocks and odd sub word line driver blocks alternately arranged between the plurality of sub memory cell array blocks; and
 a plurality of main word lines crossing the plurality of sub memory cell array blocks,
 wherein each of the plurality of sense amplification blocks comprises:
 a plurality of sub sense amplification blocks;
 a plurality of conjunction blocks arranged between the plurality of sub sense amplification blocks; and
 a plurality of selection signal lines arranged crossing the plurality of conjunction blocks,
 wherein each of the plurality of sub memory cell array blocks comprises:
 a plurality of sub word lines corresponding to each of the plurality of main word lines, and
 wherein the sub memory cell array blocks in both sides of each of the plurality of even sub word line driver blocks among the plurality of sub memory cell array blocks are included in the even page memory cell array, and the sub memory cell array blocks arranged in both sides of each of a plurality of odd sub word line driver blocks among the plurality of sub memory cell array blocks are included in the odd page memory cell array.

14. The semiconductor memory device according to claim 13, wherein the row address comprises a first row address to a fourth row address, and
 wherein the row decoder comprises:
 a selector configured to select the row address in response to the active command select the refresh row address in response to the refresh command or the hammer refresh command, to generate the first row address to the fourth row address;
 a block selection signal generator configured to decode the first row address to generate a plurality of block selection signals for selecting the plurality of memory cell array blocks;
 a plurality of first decoders configured to decode the first row address in response to at least one among the plurality of block selection signals so as to generate a plurality of main word line selection signals for selecting the plurality of main word lines; and
 a plurality of second decoders configured to decode the second row address in response to at least one among the plurality of block selection signals so as to generate a plurality of selection signals for selecting the plurality of selection signal lines, and
 wherein the fourth row address is the page selection signal.

15. The semiconductor memory device according to claim 14, wherein each of the plurality of conjunction blocks comprises:
 a plurality of selection signal drivers configured to drive the plurality of selection signals in response to the random pick signal and the fourth row address so as to generate a plurality of sub word line selection signals,
 wherein each of the even sub word line driver blocks comprises:
 a plurality of even sub word line drivers configured to select even-numbered sub word lines among the plurality of sub word lines of each of the sub memory cell array blocks in both sides, the selecting the even-numbered sub word lines based on each of the plurality of main word line selection signals and even-numbered sub word line selection signals among the plurality of sub word line selection signals, and
 wherein each of the odd sub word line driver blocks comprises:
 a plurality of odd sub word line drivers configured to select odd-numbered sub word lines among the plurality of sub word lines of each of the sub memory cell array blocks in both sides, the selecting the odd-numbered sub word lines based on each of the plurality of main word line selection signals and odd-numbered sub word line selection signals among the plurality of sub word line selection signals.

16. A memory system comprising:
 a controller circuit configured to receive a command and address and transmit and receive data; and
 a memory configured to receive the command and address and to transmit and receive the data,
 wherein the memory comprises:
 a command and address generator configured to decode a command included in the command and address to generate an active command, and to generate an address included in the command and address applied with the active command as a row address;
 a control signal generator configured to generate sequence data changing with a random sequence, and generate a random pick signal when the sequence data is equal to previously stored comparison data; and a memory cell array comprising an odd page memory cell array including a plurality of first memory cells and an even page memory cell array including a plurality of second memory cells, and configured to perform an active operation on selected first memory cells or selected second memory cells of a selected page memory cell array based on the row address in response to the random pick signal being deactivated based on the active command, or to simultaneously perform the active operation and a hidden hammer refresh operation on the selected first memory cells of the odd page memory cell array and the selected second memory cells of the even page memory cell array based on the row address and in response to the random pick signal being activated in response to the active command, wherein the active operation and the hidden hammer refresh operation are the same.

17. The memory system according to claim 16, wherein the command and address generator decodes the command and further generates a refresh command, and wherein the memory further comprises:

a hammer refresh address generator configured to receive the row address in response to the active command, to detect a corresponding row address as an aggressor row address based on the same row address being applied a specific number of times or more, and to generate at least one victim row address adjacent to the aggressor row address as a hammer refresh row address together with a hammer refresh command;

a normal refresh address generator configured to a normal refresh row address in response to the refresh command;

a selection unit configured to select the hammer refresh row address in response to the hammer refresh command or to select the normal refresh row address in response to the refresh command, so as to generate a refresh row address; and a row decoder configured to decode the row address in response to the active command and to decode the refresh row address in response to the refresh command or the hammer refresh command, so as to generate a plurality of main word line selection signals and a plurality of selection signals.

18. The memory system according to claim 17, wherein the control signal generator comprises:

a pseudorandom number generator configured to perform a linear feedback shifting operation in response to the active command to generate the sequence data changing with the random sequence;

a look-up table configured to store and output at least one among the sequence data as the comparison data; and a comparator configured to generate the random pick signal when the sequence data is equal to the comparison data.

19. The memory system according to claim 18, wherein the memory cell array comprises:

a plurality of memory cell array blocks; and a plurality of sense amplification blocks between the plurality of memory cell array blocks, wherein each of the plurality of memory cell array blocks comprises:

a plurality of sub memory cell array blocks;

a plurality of even sub word line driver blocks and odd sub word line driver blocks alternately arranged between the plurality of sub memory cell array blocks; and a plurality of main word lines arranged crossing the plurality of sub memory cell array blocks, wherein each of the plurality of sense amplification blocks comprises:

a plurality of sub sense amplification blocks;

a plurality of conjunction blocks arranged between the plurality of sub sense amplification blocks; and a plurality of selection signal lines crossing the plurality of conjunction blocks, wherein each of the plurality of sub memory cell array blocks comprises:

a plurality of sub word lines corresponding to each of the plurality of main word lines, and wherein the sub memory cell array blocks arranged in both sides of each of the plurality of even sub word line driver blocks among the plurality of sub memory cell array blocks are included in the even page memory cell array, and the sub memory cell array blocks arranged in both sides of each of a plurality of odd sub word line driver blocks among the plurality of sub memory cell array blocks are included in the odd page memory cell array.

20. The memory system according to claim 19, wherein the row address comprises a first row address to a fourth row address, and wherein the row decoder includes:

a selector configured to select the row address in response to the active command and select the refresh address in response to the refresh command or the hammer refresh command, to generate the first row address to the fourth row address;

a block selection signal generator configured to decode the first row address to generate a plurality of block selection signals for selecting the plurality of memory cell array blocks;

a plurality of first decoders configured to decode the first row address in response to at least one among the plurality of block selection signals to generate a plurality of main word line selection signals for selecting the plurality of main word lines; and a plurality of second decoders configured to decode the second row address in response to at least one among the plurality of block selection signals to generate a plurality of selection signals for selecting the plurality of selection signal lines, wherein each of the plurality of conjunction blocks comprises:

a plurality of selection signal drivers configured to drive the plurality of selection signals in response to the random pick signal and the fourth row address to generate a plurality of sub word line selection signals, wherein each of the even sub word line driver blocks comprises:

a plurality of even sub word line drivers configured to select even-numbered sub word lines among the plurality of sub word lines of each of the sub memory cell array blocks arranged in both sides in response to each of the plurality of main word line selection signals and even-numbered sub word line selection signals among the plurality of sub word line selection signals, and wherein each of the odd sub word line driver blocks comprises:

a plurality of odd sub word line driver configured to select odd-numbered sub word lines among the plurality of sub word lines of each of the sub memory cell array blocks arranged in both sides in response to each of the plurality of main word line selection signals and odd-numbered sub word line selection signals among the plurality of sub word line selection signals, and
wherein the fourth row address is the page selection signal.

* * * * *